(12) United States Patent
Voser et al.

(10) Patent No.: US 9,694,990 B2
(45) Date of Patent: Jul. 4, 2017

(54) TRANSPORT AND HANDING-OVER ARRANGEMENT FOR DISC-SHAPED SUBSTRATES, VACUUM TREATMENT INSTALLATION AND METHOD FOR MANUFACTURE TREATED SUBSTRATES

(71) Applicant: OC Oerlikon Balzers AG, Balzers (LI)

(72) Inventors: Stephan Voser, Sevelen (CH); Bruno Gaechter, Ruethi (CH); Pierre Matteacci, Pfafers (CH)

(73) Assignee: EVATEC AG, Trübbach (CH)

( * ) Notice: Subject to any disclaimer, the term of this patent is extended or adjusted under 35 U.S.C. 154(b) by 310 days.

(21) Appl. No.: 13/916,910

(22) Filed: Jun. 13, 2013

(65) Prior Publication Data
US 2013/0343839 A1   Dec. 26, 2013

Related U.S. Application Data

(60) Provisional application No. 61/659,545, filed on Jun. 14, 2012.

(51) Int. Cl.
| | |
|---|---|
| *H01L 21/677* | (2006.01) |
| *B65G 49/00* | (2006.01) |
| *B25J 15/06* | (2006.01) |
| *H01L 21/673* | (2006.01) |

(52) U.S. Cl.
CPC .......... *B65G 49/00* (2013.01); *B25J 15/0608* (2013.01); *H01L 21/67346* (2013.01); *H01L 21/67709* (2013.01)

(58) Field of Classification Search
CPC .. B25J 15/0608; B65G 47/1485; B65G 57/04; B65G 59/04; H01L 21/67709; H01L 21/67346; Y10S 901/40
See application file for complete search history.

(56) References Cited

U.S. PATENT DOCUMENTS

| | | | | | |
|---|---|---|---|---|---|
| 3,661,253 | A | * | 5/1972 | Cronkhite | ..................... 206/712 |
| 3,831,780 | A | * | 8/1974 | Skarin et al. | ............... 414/796.7 |
| 4,121,865 | A | * | 10/1978 | Littwin, Sr. | ........... B66C 1/0218 |
| | | | | | 294/186 |
| 5,195,729 | A | * | 3/1993 | Thomas | ............ H01L 21/67346 |
| | | | | | 269/21 |
| 5,881,649 | A | * | 3/1999 | Hasegawa et al. | ........... 104/167 |
| 6,453,543 | B1 | | 9/2002 | Tinner | |
| 6,538,544 | B1 | | 3/2003 | Hardy | |

(Continued)

FOREIGN PATENT DOCUMENTS

| | | | |
|---|---|---|---|
| DE | 100 58 770 A1 | 6/2002 | |
| DE | 102008012688 B3 * | 7/2009 | .......... B25J 15/0608 |

(Continued)

*Primary Examiner* — James Keenan
(74) *Attorney, Agent, or Firm* — Pearne & Gordon LLP

(57) ABSTRACT

A transport and handing-over arrangement for disc shaped substrates, comprising a carrier (3) and a take-over arrangement (15). Both are moveable relative to each other. A relatively heavy substrate carrier (7) of magnetizable material is taken-over from the take-over arrangement (15) by distance control of a permanent magnet (17) at the take-over arrangement (15) or is returned therefrom to a carrier (3). The controlled drive of the permanent magnets (17) in the take-over arrangement (15) is performed by means of pneumatic piston/cylinder arrangements (19).

12 Claims, 4 Drawing Sheets

(56) References Cited

U.S. PATENT DOCUMENTS

Figure 1:
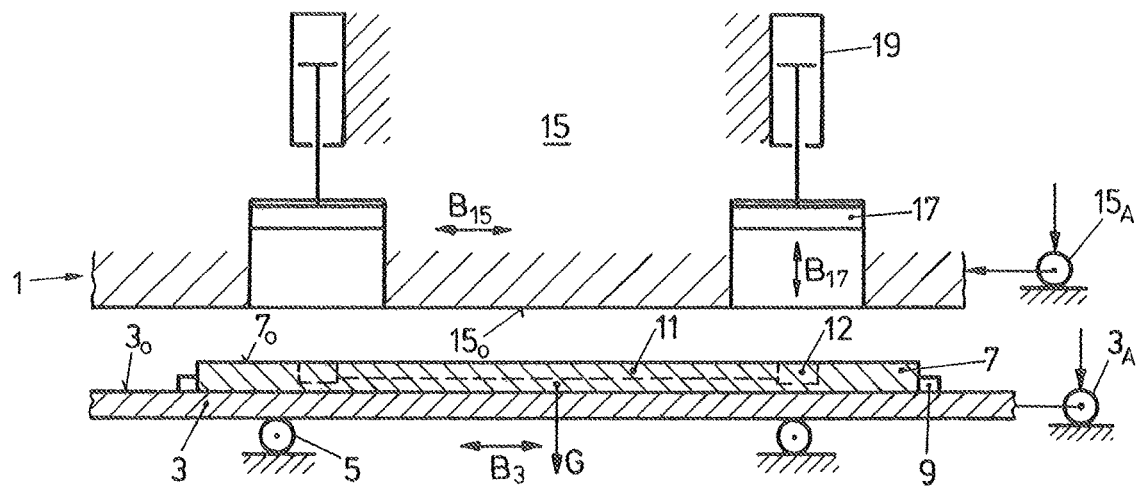

| | | | |
|---|---|---|---|
| 7,014,415 B2* | 3/2006 | Yoshizawa | H01L 21/6734 414/422 |
| 7,568,281 B2* | 8/2009 | Yoshizawa | H01L 21/6734 198/465.1 |
| 8,485,576 B2* | 7/2013 | Melville et al. | 294/86.4 |
| 9,525,099 B2* | 12/2016 | Bluck | C23C 14/042 |
| 2002/0168839 A1* | 11/2002 | Yanagi | G03F 7/2014 438/551 |
| 2006/0081468 A1 | 4/2006 | Seddon | |
| 2011/0141448 A1* | 6/2011 | Aoki et al. | 355/72 |
| 2013/0287526 A1* | 10/2013 | Bluck et al. | 414/217 |

FOREIGN PATENT DOCUMENTS

| | | | | |
|---|---|---|---|---|
| DE | 102010040642 A1 * | 3/2012 | | B25J 15/0608 |
| EP | 0 931 175 B1 | 7/1999 | | |
| EP | 1273407 A1 * | 1/2003 | | B25J 15/0608 |
| EP | 1 553 578 A1 | 7/2005 | | |
| FR | 2668084 A1 * | 4/1992 | | B25J 15/0608 |
| WO | 98/14632 A1 | 4/1998 | | |
| WO | 2004/070391 A1 | 8/2004 | | |
| WO | WO 2010/124767 A1 * | 11/2010 | | B65G 57/04 |

\* cited by examiner

TRANSPORT AND HANDING-OVER ARRANGEMENT FOR DISC-SHAPED SUBSTRATES, VACUUM TREATMENT INSTALLATION AND METHOD FOR MANUFACTURE TREATED SUBSTRATES

The present invention concerns a transport and handing-over arrangement for disc-shaped substrates.

A transport and handing-over arrangement is known from EP 0 931 175, in which anchor parts of magnetizable material are releasably fixed to the substrates. The substrate with the anchor part is held by magnetic force on a first part of the installation, which can be named a carrier, by means of a permanent magnet attached to the latter. Is the substrate with the attached anchor part to be handed-over to a second part of the installation, which can be named a take-over arrangement, the take-over arrangement and carrier are moved into a take-over position. There, permanent magnets installed in the take-over arrangement are moved out of a retracted position towards the carrier arrangement. Thereby the magnetic forces of the permanent magnets in the take-over arrangement are sufficient to overcome the magnetic forces from the anchor on the carrier. The anchor part, together with the substrate, is handed-over to the take-over arrangement.

A disadvantage of this procedure is that anchor parts must be attached to the substrates, to say as catches, which in the course of a substrate treatment may massively disturb such treatment. The results in the fact are that the aforementioned anchor parts in any case also have to be removed from the substrates.

Furthermore, in the aforementioned procedure, magnets must be provided on the carrier side as well as on the take-over arrangement side respectively adjusted to each other in function of the carrier/take-over arrangement distance. It should furthermore be noted that, according to the known technique, it is the substrates which carry the anchor parts. Thin, dimensionally unstable substrates cannot be handled in the known manner, which particularly also relies on the substrates comprising a central hole, to which a respective anchor part is attached.

It is an object of the present invention to propose a transport and handing-over arrangement for disc-shaped substrates which permits handing-over the substrate in a simple, fast and trouble-free manner, independently of the substrate type, within the widest bounds.

To this end at the transport and handing-over arrangement of the present invention, a carrier with a carrier surface is provided. Tray-shaped substrate carriers are provided on the carrier surface, which are held on the carrier surface by their weight. The substrates each also feature at least one planar accommodation for a substrate.

At least a part on the substrate carriers consists of magnetisable material.

Due to the tray-shaped construction of the substrate carriers with the planar accommodations, it is ensured that, completely independent of the form, thickness and dimensional stability of the respective substrates, these latter lie on the substrate carriers.

Furthermore, on the transport and handing-over arrangement according to the invention, a take-over arrangement is provided having a take-over surface opposite and spaced from the carrier surface.

Carrier and take-over arrangement are controllably movable relative and parallel to each other, so that thereby at least one of the substrate carriers can be respectively brought sequentially into alignment with the take-over surface. Hence, one substrate carrier after the other, on the carrier surface, comes into alignment with the take-over surface of the take-over arrangement, so that a take-over is possible there.

Furthermore, at least one permanent magnet is provided on the take-over arrangement. The distance between the at least one permanent magnet and the at least one part of magnetisable material on the substrate carrier is controllably variable in two predetermined distance positions, such that in a first distance position the magnetic force acting upon the substrate carrier is larger than the weight of the substrate carrier, in the second distance position, smaller.

By approaching the permanent magnet and substrate carrier into the first distance position, the substrate carrier is taken-over by the taking-over arrangement against its own weight, if the distance position is increased into the second position as aforementioned, the substrate carrier is either left on the carrier surface or re-transferred to this latter.

Thereby, due to the trey shaped construction of the substrate carriers, substrate carriers of relatively large weight are utilised. This weight simplifies however the overall conception to a large degree, since for the transfer, magnetically, only the force of gravity must be overcome, and no permanent magnets are to be provided on the carrier to hold the substrate carrier there.

Self-evidently, the substrate carriers may comprise several planar accommodations for one or more substrates.

A good embodiment of the transport and handing-over arrangement according to the present invention, which may be combined with all the embodiments still to be described, insofar as non-contradicting, is that the take-over arrangement comprises, in a pneumatic cylinder, at least one piston which is moveable towards and from the carrier surface and which is coupled with the at least one permanent magnet.

An exceptionally robust driving system for the aforementioned distance control is realised by means of the aforementioned pneumatic cylinder/piston drive of the at least one permanent magnet. If two and more permanent magnets are provided on the take-over arrangement, it is to all intents and purposes possible to drive two or even more of the permanent magnets by means of a common pneumatic cylinder/piston arrangement. Bearing in mind however that the distance adjustment between the permanent magnets and the one or the more parts of magnetisable material on the substrate carrier is relatively non-critical, it is advantageous from a constructional perspective to drive each of several permanent magnets distributed along the transfer surface by means of a small pneumatic cylinder/piston arrangement.

In a further good embodiment of the transport and handing-over arrangement according to the invention, the at least one permanent magnet is encapsulated together with the piston in the aforementioned pneumatic cylinder. One or more permanent magnets, normally made of rare earths, can be provided to the aforementioned piston, according to its design. Possibly, the permanent magnet, provided with corresponding piston rings, can form the piston. Thereby all danger of contamination of the permanent magnets is avoided, since they are encapsulated from the outside world in the pneumatic cylinder and bathed in compressed air.

A further good embodiment of the transport and handing-over arrangement according to the present invention is that the take-over arrangement is controllably driven towards and from the carrier surface, by means of a drive.

Assuming a fixed distance between the take-over surface and the carrier surface, it is evident that, with substrate carriers deposited on the carrier surface, then when the at least one permanent magnet on the take-over arrangement is driven into the first distance position, the substrate carrier practically jumps onto the take-over surface. Likewise, the substrate carrier drops abruptly back from the take-over surface onto the carrier surface when the at least one permanent magnet on the non-distance-adjustable take-over arrangement is withdrawn into the second distance position. The latter embodiment allows to avoid this. Thereby, for take-over, first the take-over surface is lowered onto the substrate carrier on the carrier surface, then the at least one permanent magnet is driven into its first distance position. The substrate carrier hardly moves, but is pulled onto the take-over surface. Now the take-over arrangement together with the substrate carrier can be lifted off the carrier surface in order to further transport the substrate carrier to a particular destination.

Conversely, for returning a substrate carrier onto the carrier surface, the take-over arrangement is first lowered far enough that the substrate carrier abuts on the carrier surface. Only then is the at least one permanent magnet withdrawn from its first distance position (holding position) into the second position, whereby the substrate carrier is returned with its whole weight onto the carrier surface.

This embodiment can furthermore be combined with all embodiments prior addressed and subsequently to be addressed insofar as non-contradicting.

It is a good embodiment, combinable with all previously and subsequently addressed embodiments so long as non-contradictory, to provide the substrate carriers of stainless magnetisable steel. Thereby they are single-piece and are constructed with one or several accommodations each for substrates. On the other hand, in a good embodiment as well, so long as non-contradictory, combinable with each of the previously and subsequently addressed embodiments, the substrate carriers are constructed in multiple pieces, for instance with aluminium and steel parts, combined by screwing, welding etc. to respective substrate holders. Also, their weight can be optimised to the necessary degree by providing cutouts or through-holes in the substrate carriers.

With a view on a possible multi-part construction of the substrate carriers, the high thermal load of the substrate carrier to which the substrate carriers are often exposed in the process of treating the substrates, along with accompanying material-specific thermal expansions, must be taken into account.

Although it is by all means possible to provide the at least one permanent magnet freely exposed towards the carrier surface, it is a good embodiment of the transport and handing-over arrangement according to the present invention, combinable with all the previous and subsequently addressed embodiments, so long as non-contradictory, to cover the at least one permanent magnet on the take-over arrangement by a material layer towards the carrier surface, for example of aluminium or a plastic.

In a further good embodiment, again combinable with all previously and subsequently addressed embodiments, so long as non-contradictory, an elastic damper member is provided between the take-over surface and the respective substrate carrier and/or between the respective substrate carrier and the carrier surface, which damps impact of the substrate carrier on the take-over surface during take-over and/or impact of the substrate carrier on the carrier surface during return to the latter.

In a good embodiment, the damper member comprises an elastic ring, for instance an O-ring. In the case that the damper member is arranged between the take-over surface and the substrate carrier, such an elastic ring can be arranged in the transfer surface and/or in the surface of the substrate carrier facing the transfer surface, preferably in the former. In the case that additionally or alternatively the damper member is arranged between the substrate carrier (back side) and the carrier surface, an elastic ring can be arranged on the carrier surface and/or on the surface of the substrate carrier facing this latter. The elastic ring protrudes, considered in cross-section, above the surface on which it is arranged. In principle, providing the damper member, particularly in the form of an elastic ring, on the substrate carrier is also advantageous, because such a damper member on the substrate carrier can be easily exchanged, without for instance requiring, for example in connection with a substrate treatment arrangement, that the transport and handing-over arrangement be stopped.

Although in a good embodiment in particular the elastic ring is provided respectively on one of two cooperating surfaces, namely on the take-over surface or to the substrate carrier surface facing the take-over surface and/or on the carrier surface or on the substrate carrier rear surface facing the carrier surface, it is by all means possible to provide mutually cooperating damper member, such as particularly elastic rings, respectively on both of the mutually facing surfaces.

In a further good embodiment, combinable with all of the previously and subsequently addressed embodiments, so long as non-contradicting, the aforementioned elastic ring surrounds the one or several accommodations for substrates, as a damper member on the substrate carrier facing the take-over arrangement. It runs substantially along the periphery of the tray-shaped substrate carrier. This has the advantage that during a treatment of the substrates on the substrate carriers, for instance by coating, the coating of the substrate carrier in the area of the accommodation hardly has any effect. To this point it is also possible to mask the periphery area of the tray-shaped substrate carriers from being treated, or not to expose such a periphery area to the treatment at all.

In a further good embodiment which can be combined with all the previously and subsequently addressed embodiments, when not in contradiction, the substrate carriers have a peripheral uninterrupted or interrupted protruding rim around the one or the several accommodation recesses.

Thereby a hollow space between the take-over surface and the substrate on the substrate carrier is ensured and in any case it is prevented that the substrates touch the take-over surface.

In a further good embodiment, the at least one elastic ring is arranged on the aforementioned rim.

The substrate carrier's own weight ensures that this latter cannot under any circumstances lift from the carrier surface. Positioning guides, such as protruding ribs, pins or similar, can however be provided on the carrier surface so as to impede lateral sliding of the substrate carrier at high accelerations of the carrier. Provision of a dynamically-controllable organ for retaining the substrate carriers on the carrier surface, such as controllable pawls, catches, etc is however avoided on the transport and handing-over arrangement according to the invention.

This applies similarly in respect of the holding of substrates on the substrate carriers. In a good embodiment of the transport and handing-over arrangement according to the invention, combinable with all of the prior and subsequently addressed embodiments, in so far as non-contradictory, the one or several accommodations on the substrate carriers are formed by accommodations in the substrate carrier shaped similarly to the substrates, thereby adapted to the respectively utilised customary substrate shapes, thus preferably rectangular, quadratic, or circular. The disc-shaped substrates lie in these recesses, whose edges surround the substrates not entirely form-fitted, but nevertheless tightly, with little play. Taking into account the tray-shape of the substrate carriers, it is readily possible to provide for various substrate shapes on one and the same peripheral part of a substrate carrier, in which exchangeable inserts with respective recesses adapted to the substrate are provided, inserts which are substrate-shape-specific deposited into substrate carrier frames.

In a further embodiment of the transport and handing-over arrangement according to the present invention, which is combinable with all previously and subsequently mentioned embodiments, insofar as non-contradictory, lateral guides for the lateral position of the substrate carriers are provided on the substrate carrier and/or on the take-over surface and/or on the carrier surface.

Thereby it is ensured that when the substrate carrier is positioned in alignment with the take-over arrangement, the parts of magnetisable material provided thereupon are aligned as accurately as possible with the at least one permanent magnet on the take-over arrangement, such that the magnetic forces work perpendicularly to the substrate carriers, and, particularly during take-over of the substrate carriers on the take-over arrangement, a lateral shifting component is avoided.

When the take-over arrangement is exposed to accelerations after substrate take-over, such as due to a stepping drive, the previously mentioned lateral guides between the substrate carrier and take-over arrangement also ensure that the respective substrate carrier does not slide on the take-over surface, notwithstanding the magnetic retention.

In a further embodiment of the transport and handing-over arrangement according to the present invention, combinable with all previously mentioned and subsequently mentioned embodiments, in so far as non-contradictory, at least two of the take-over arrangements are provided, working in common with one carrier. The take-over surfaces of the least two take-over arrangements are positioned along a common plane, which is perpendicular to an axis perpendicular to the carrier surface, around which the take-over arrangements are controllably drivably pivotable together. Thereby for instance two-armed robots are implemented, which carry a take-over arrangement at the end of each of the two arms. By stepwise or continuous pivoting of this two-or-more-armed robot, one take-over arrangement after the other is pivoted sequentially over the carrier surface.

The present invention further concerns a vacuum treatment installation with at least one vacuum treatment chamber for substrates, wherein a transport and handing-over arrangement for substrates, as previously described, is positioned before or after, or each before and after, the vacuum treatment chamber.

Furthermore, the present invention relates to a substrate carrier which comprises a carrier tray with at least one recess in its one surface, which is geometrically similar to the shape contour of a substrate to be received therein and wherein at least one part of the carrier tray consists of magnetisable material. The previously mentioned recess surrounds with its rim the contour of a disc-shaped substrate lain therein, if not exactly form-fitted, then at least with little play.

Such a substrate carrier can weigh several kilograms, for instance 2 kg, and is utilised in particular in the framework of the transport and handing-over arrangement according to the present invention. It can be single-piece, for instance made of magnetisable stainless steel or multi-piece with for instance aluminium and steel parts, for example screwed or welded. It can comprise further cutouts or through-openings to optimise its weight. Furthermore, reference can be made to the respective embodiments described in connection with the transport and handing-over arrangement according to the invention in connection with the construction of the substrate carrier such as with surrounding rim, elastic ring, etc.

Furthermore, the present invention relates to a method of manufacturing substrates treated in a treatment station, wherein untreated substrates are led to, and treated substrates are led from the treatment station. Therein, the leading to- and/or -from comprises the following:

on a carrier with a carrier surface, transporting substrate carriers held on the carrier surface by gravity and lying thereon, each with at least a planar substrate accommodation with a substrate and consisting at least partly of magnetisable material;

relatively moving a take-over arrangement with a take-over surface, opposite to and spaced from the carrier surface and with at least one permanent magnet and the carrier to a position in which the take-over surface and a substrate carrier are mutually aligned;

overcoming the weight of the substrate carrier by raising the magnetic force effective between the part and the at least one permanent magnet, and thereby taking over the substrate carrier with the substrate by the take-over arrangement;

transporting the substrate carrier with the substrate on the take-over arrangement towards the treatment station or away from the treatment station; and treating the substrate in the treatment station.

Figure 2:
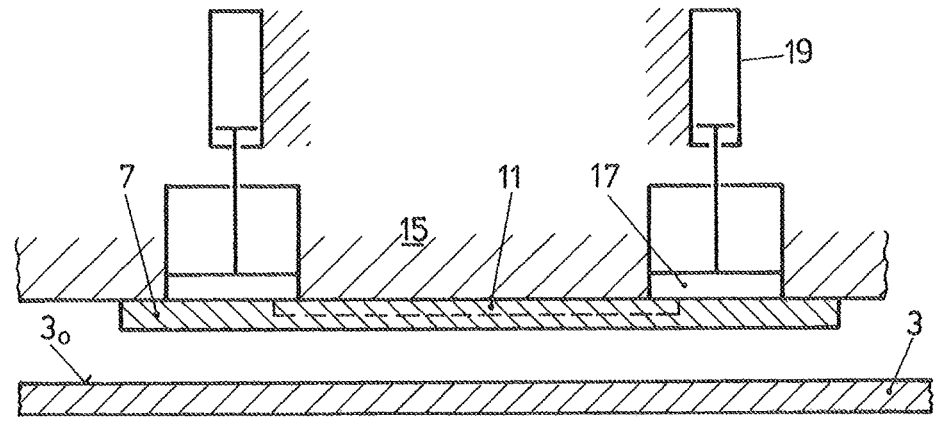
Figure 3:
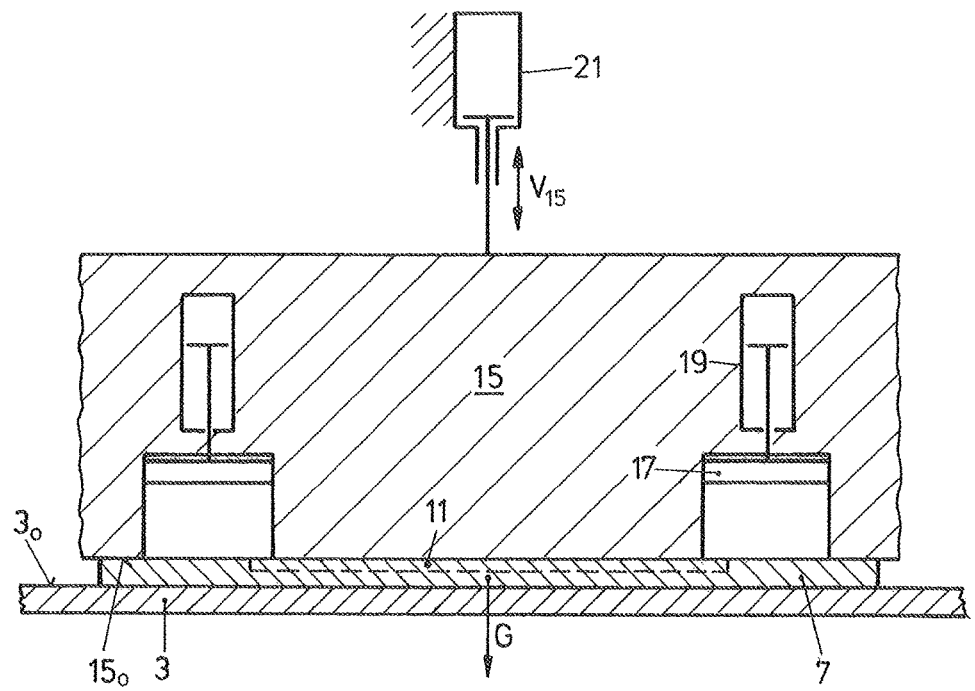
Figure 4:
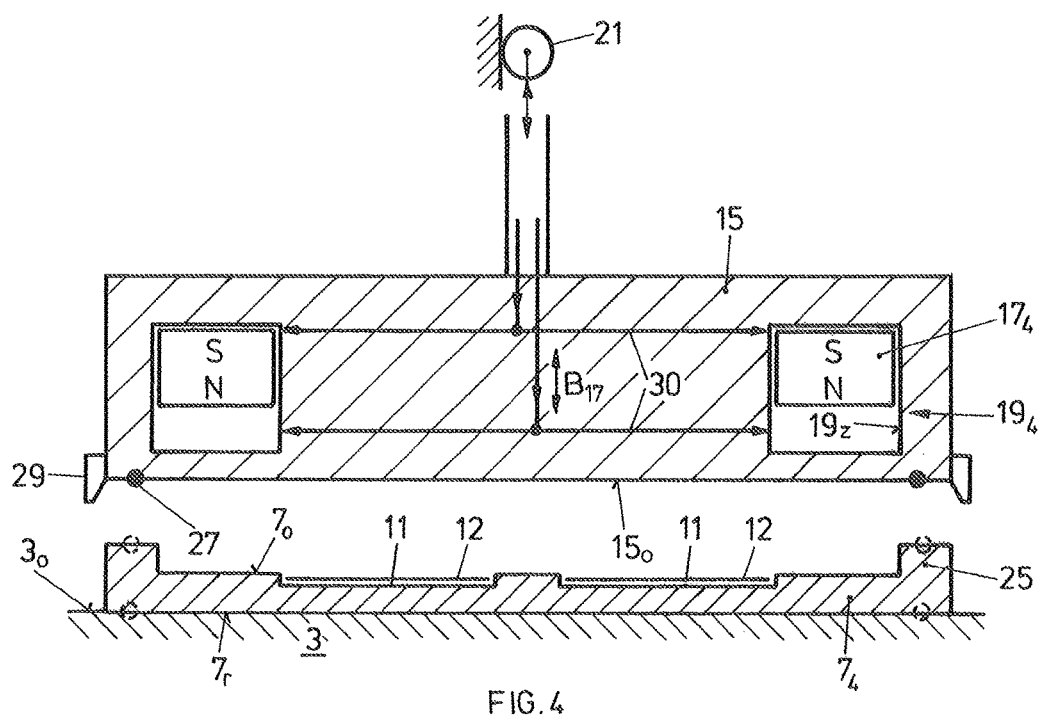
Figure 5:
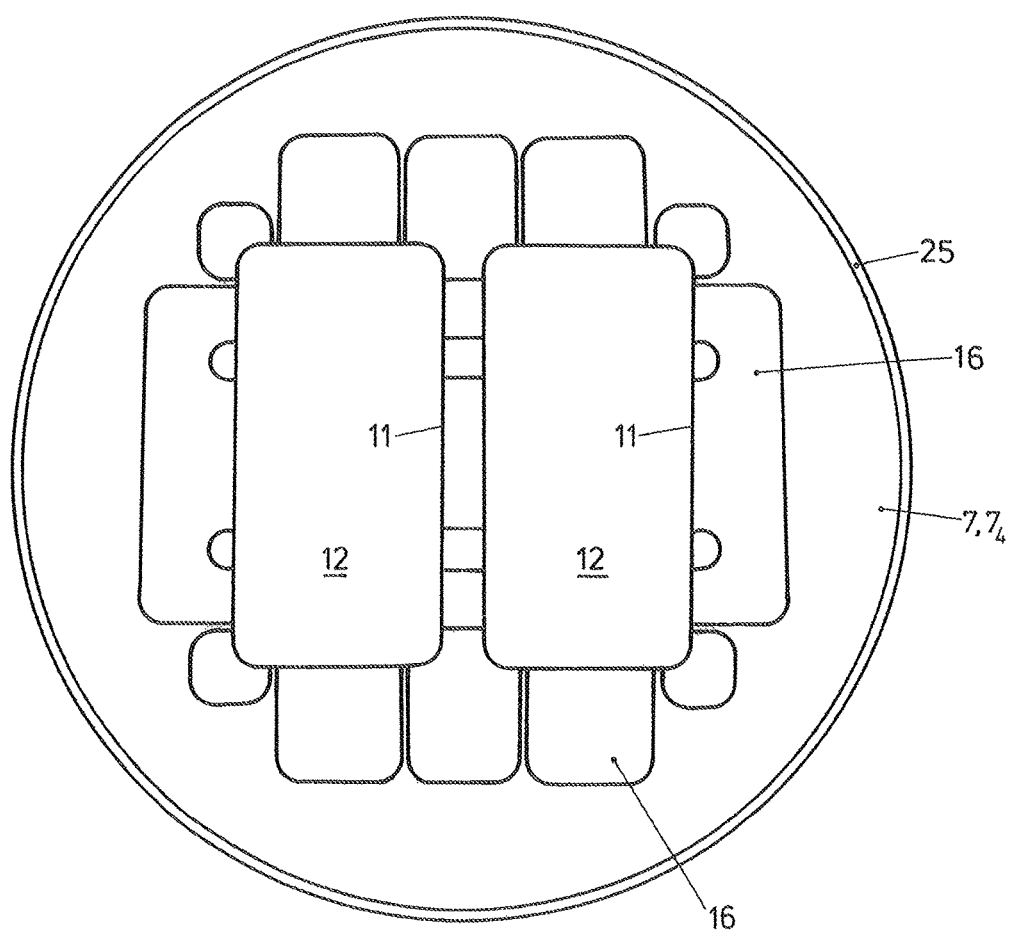
Figure 6:
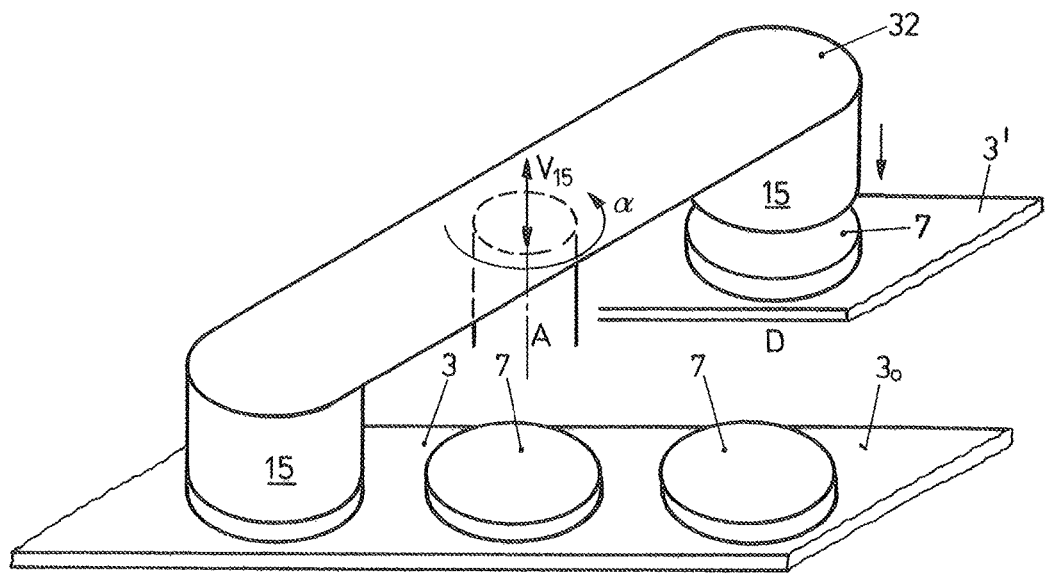
Figure 7:
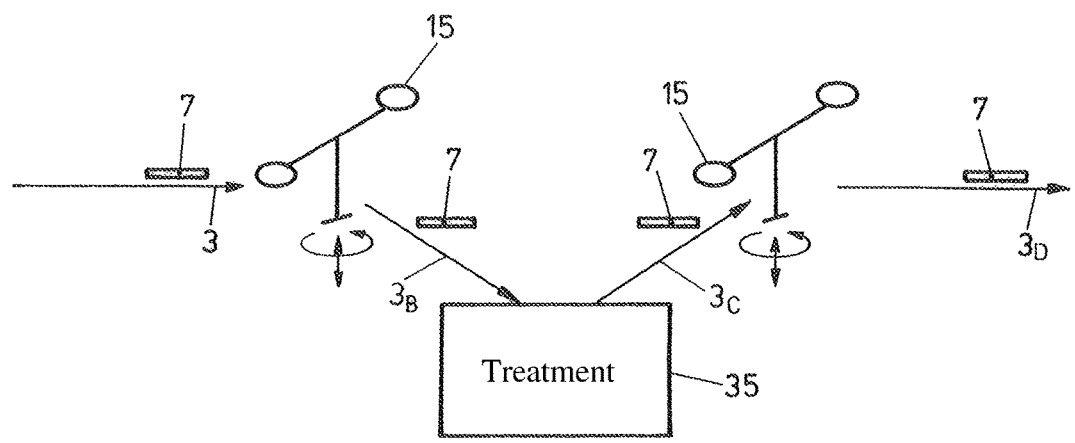

Examples of the invention will now be explained with reference to the figures:

These show:

FIG. 1 schematically and simplified, a first embodiment of a transport and handing-over arrangement according to the invention, in a first working position;

FIG. 2 the device according to FIG. 1 in the same representation in a second working position;

FIG. 3 a further embodiment of the transport and handing-over arrangement according to the invention in schematic, simplified representation, analogous to those of FIGS. 1 and 2;

FIG. 4 a further embodiment of the arrangement according to the invention, in simplified, schematic form;

FIG. 5 a top-view of a substrate carrier according to the invention, as it can be applied on the transport and handing-over arrangement according to the invention in a variant embodiment;

FIG. 6 schematically in the form of a functional/signal-flow diagram, the manufacturing of treated substrates according to the invention with the help of the transport and handing-over arrangement according to the invention;

FIG. 7 schematically and simplified, the manufacturing of a treated substrate with a transport and handing-over arrangement to the invention.

FIG. 1 illustrates, simplified and schematically, the basic principle of a transport and handing-over arrangement according to the present invention. The transport and handing-over arrangement 1 comprises a carrier 3 with a carrier surface $3_o$, which lies substantially horizontally. As schematically illustrated by means of rollers 5, the carrier 3 is movable forwards and/or backwards, controlled and driven by a schematically-illustrated drive $3_A$. Substrate carriers 7 lie on the carrier surface $3_o$, whose weight G is sufficient to hold them in position on the carrier surface $3_o$. If the carrier 3 is strongly accelerated, such as for instance by stepwise feeding in one of the directions B3, non-dynamically controlled retention means, such as protrusions or pins 9 are provided which prevent inertia-related sliding of the substrates carrier 7.

FIG. 1 merely illustrates one of the substrate carriers 7. The substrate carrier 7 exhibits on its free surface $7_o$ one or more recesses 11 as substrate accommodation. The recesses 11 are geometrically similar to the contour of a respective substrate (not illustrated) to be received therein, and thus surround the substrate with little play. The substrate carriers 7 are constructed in one or more pieces and comprise in each case a part of magnetisable material, such as of magnetisable stainless steel.

In the illustration of FIG. 1, the substrate carrier 7 is single-piece and thereby consists of the aforementioned magnetisable material. It is however in any case possible to create the substrate carriers from multiple parts, for instance from parts consisting of aluminum and parts consisting of the aforementioned magnetisable material, screwing or welding these parts and/or to provide cut-outs and/or through openings on the substrate carrier. Thereby the weight G of the substrate carrier 7 is so optimised that on the one hand good retention with sufficient retention friction on the carrier surface $3_o$ is ensured, and on the other hand not too great forces must be exerted during a yet-to-be-described take-over action.

Also, several recesses 11 each for a substrate can be provided on the substrate carrier 7, formed as has already been described. If it is desired to be able to flexibly receive variously-formed substrates on one substrate carrier 7, the substrate carrier 7 can comprise replaceable inserts such as schematically illustrated with 12, each with substrate-shape-specific recesses 11. In this case the magnetisable material is not provided on such inserts 12, but is provided on the frame-like part of the substrate carrier 7 which receives such inserts 12.

The disc-shaped substrates received in the recesses 11 are areally supported therein and substrates can be received therein ranging from flexible, thin, film-like substrates to thicker, rigid substrates.

Furthermore, the transport and handing-over arrangement 1 comprises a schematically-illustrated take-over arrangement 15. This has a take-over surface $15_o$ and is normally controllably movable in at least one of the illustrated directions continuously or in steps, as illustrated with the double arrow B15, by means of a controlled drive $15_A$. The carrier 3 and the take-over arrangement 15 are generally moveable relative to each other and substantially parallel to the surfaces $3_o$, $15_o$, by means of one or by means of two drives such that a substrate carrier 7 on the carrier surface $3_o$ can be respectively brought into alignment with the take-over surface $15_o$.

One or several permanent magnets 17 is/are provided in the take-over arrangement 15. According to the illustration of FIG. 1, the one or more than one permanent magnets 17 are controllably movably driven by means of pneumatically driven piston/cylinder arrangements 19 in the direction illustrated with the double arrow B17 towards the carrier surface $3_o$ or away therefrom. In the schematic illustration according to FIG. 1, the respective magnet or each of the magnets 17 is/are actuated by means of a specifically allocated small piston/cylinder arrangement 19. If several of the magnets 17 are provided, which is usually the case, and are distributed along the take-over surface $15_o$, such that they substantially cover a peripheral area of an aligned substrate carrier 7, it is of course possible to drive two or more of the magnets 17 commonly by means of one pneumatic piston/cylinder arrangement 19. In the illustration of FIG. 1, the permanent magnets 17 are each coupled to pistons of the pneumatic piston/cylinder arrangement 19.

The arrangement 1 according to FIG. 1 functions as follows: By relative movement of the take-over arrangement 15 and of the carrier 3, a substrate carrier 7 lying on the carrier surface $3_o$ is aligned with the take-over surface $15_o$ and thereby with the one or more permanent magnets 17. Thereby, as shown in FIG. 1, the one or several permanent magnets 17 are in the first distance position with respect to the carrier surface $3_o$ and thus with respect to the substrate carrier 7, i.e. in the "OFF" position. The magnetic force of the magnets 17 in this "OFF" position is insufficient to overcome the weight G of the substrate carrier 7.

Now, the permanent magnets 17 are lowered towards the carrier surface $3_o$ into a second distance position, the "ON" position, by means of the pneumatic piston/cylinder arrangement 19.

There, the magnetic forces between the permanent magnets 17 and the magnetisable material on the substrate carrier 7 are sufficient to overcome the substrate carrier weight G, thus the substrate carrier 7, with or without a substrate in the recess 11, jumps onto the take-over surface $15_o$. The take-over arrangement 15 can now be moved together with the substrate carrier 7 and, if applicable, the substrate, to a particular target position (not illustrated), where the substrate carrier and, if applicable, the substrate are handled further, for instance are transferred to a further carrier or conveyor.

FIG. 2 illustrates the arrangement according to FIG. 1 with magnets 17 positioned in the "ON" position, as well as with a substrate carrier 7 which has been taken-over onto the take-over arrangement 15. Following the explanations in respect of FIG. 1, further explanations in respect of FIG. 2 are not necessary for the skilled person. All parts explained in reference to FIG. 1 which are not necessary for explaining the take-over process have been left out in FIG. 2 for reasons of clearness.

As is evident from FIG. 2, for returning a substrate carrier 7 with or without a substrate (not illustrated) present in the recess 11, the at least one or the several permanent magnets 17 are returned into the "OFF" position according to FIG. 1 by means of the pneumatic piston/cylinder arrangement 19, upon which the substrate carrier 7 falls onto the carrier surface $3_o$ by gravity.

From the explanations of FIGS. 1 and 2 it can be seen that on the one hand the substrate carrier 7 jumps towards the take-over surface $15_o$ on take-over and, on the other hand, on handing-over, falls abruptly from the take-over arrangement 15 onto the carrier surface $3_o$. To carry out a gentle take-over of the substrate carrier 7 onto the take-over surface $15_o$, or a gentle handing-over of a substrate carrier 7 to the carrier surface $3_o$, the transport and handing-over arrangement according to the invention, as illustrated in FIGS. 1 and 2, is further constructed according to FIG. 3. Departing from the simplified representation of FIG. 2, the embodiment according to FIG. 3 differs as follows:

The take-over arrangement 15 is, on its part, controllably drivably movable in a direction according to double arrow V15 towards the carrier surface $3_o$ or retractable from the carrier surface $3_o$, by means of a drive 21, which is for instance a pneumatic piston/cylinder arrangement. In this embodiment of the transport and handing-over arrangement according to the invention, the take-over and handing-over of the substrate carrier 7 is effected as follows:

With the substrate carrier 7 aligned with the take-over surface and aligned with the permanent magnets 17, lying on the carrier surface $3_o$ under the force of gravity, the take-over arrangement 15 is lowered onto or immediately over the substrate carrier 7 by means of the drive 21, with the permanent magnets 17 in the "OFF" position. The magnetic force of the permanent magnets 17 is insufficient to overcome the weight of the substrate carrier 7.

Now the permanent magnets 17 are advanced into the "ON" position as illustrated in FIG. 2, by means of the pneumatic piston/cylinder arrangement 19, whereby the substrate carrier weight G is overcome. Without having changed position, the substrate carrier 7 now adheres to the take-over surface $15_o$. The take-over arrangement 15 is lifted together with the substrate carrier 7, with or without a substrate in the recess 11, from the carrier surface $3_o$, with the permanent magnets 17 remaining in the "ON" position. As previously described, the take-over arrangement 15 can now be moved with the substrate carrier to a destination position (not illustrated).

For returning a substrate carrier 7 from the take-over surface $15_o$ to the carrier surface $3_o$, the take-over arrangement 15 is lowered towards the carrier surface $3_o$ by means of the drive 21 with the permanent magnet 17 in the "ON" position, until the substrate carrier 7 lies on the said carrier surface $3_o$. The permanent magnet or magnets 17 are only now withdrawn into the "OFF" position (according to FIG. 1) by means of the pneumatic piston/cylinder arrangement 19, whereby the substrate carrier 7 lies with its weight G on the carrier surface $3_o$ and remains there was the take-over arrangement 15 is again raised by means of the drive 21.

In this manner, a gentle, shock-free take-over and/or handing-over of the substrate carrier 7 to the take-over surface $15_o$ and/or to the carrier surface $3_o$ is realised. It should be expressed at this point that the said return or handing-over does not necessarily have to take place on the same carrier 3 from which the substrate carrier 7 was taken-over. The return transfer can be, and often is, carried out on a further carrier (not illustrated) in the destination position of the take-over arrangement 15.

FIG. 4 illustrates in a further embodiment, again simplified and schematically, a transport and handing-over arrangement according to the present invention. The illustration according to FIG. 4 departs in principle from the illustration according to FIG. 3 and the corresponding embodiment. It differs therefrom especially by a special construction of the pneumatic piston/cylinder arrangement for driving the permanent magnets and the specific construction of the substrate carriers, and by the mutual effect of the substrate carrier and the respective abutment surfaces and its accommodations. All of these specific variants are not bound to the realisation according to FIG. 3, rather they can be each carried out individually or in combination in the embodiment according to FIG. 1 or 2.

Components and parts of the transport and handing-over arrangement which have already been described are addressed with the same reference signs in FIG. 4 as have already been used and described in connection with FIGS. 1 to 3.

Concerning the Specific Construction of the Pneumatic Piston/Cylinder Arrangements 19:

As can be seen in FIG. 4, the pneumatic piston/cylinder arrangements $19_4$, which are controlled by compressed air lines 30 in the descending and retracting directions B17, are provided with pistons which directly form the permanent magnets $17_4$, or which carry these magnets (not illustrated) directly on their surfaces facing the carrier surface $3_o$. Thereby, the permanent magnets $17_4$ are encapsulated in the pneumatic cylinders $19_4$. Thereby, an extremely compact and robust construction of the moveable permanent magnets $17_4$ and of their drive in the take-over arrangement 15 is realised.

The exemplified construction of pneumatic piston/cylinder arrangements and permanent magnets is, as addressed, also applicable to the embodiment of the transport and handing-over arrangement according to FIGS. 1 and 2 with the corresponding advantages.

Concerning Substrate Carrier 7:

According to FIG. 4, the substrate carrier $7_4$ comprises a peripheral protruding rim 25. Thereby it is ensured that substrates 12, also possibly with applied coatings, lying in the one or more recesses 11 never come into contact with the take-over surface $15_o$. It is equally ensured thereby that, on the substrate carrier $7_4$, in areas around the recesses, deposited coating material never comes into contact with the take-over surface, whereby the risk of forming particles is reduced. Furthermore, dampers are provided between the take-over surface $15_o$ and the surface $7_o$ of the substrate carrier $7_4$ facing theretowards and/or between the back-side substrate surface $7_r$ of the substrate carrier $7_4$ and the carrier surface $3_o$, to dampen any possibly occurring shocks during take-over or handing-over of the substrate carrier $7_4$. To this end, as shown in FIG. 4, in a good embodiment of such a damper member, a ring 27, similar to a sealing ring, of elastic material is inletted on the take-over surface $15_o$ and protrudes above the said surface $15_o$. It is however possible and possibly also advantageous to provide the damper member, particularly a surrounding ring of elastic material on the surface $7_o$ of the substrate carrier $7_4$ facing the take-over surface $15_o$, particularly on its peripheral protruding rim 25, as illustrated in broken lines. As is further illustrated in FIG. 4 in broken lines, additionally or alternatively such a ring 27 can either be provided on the periphery of the rear surface $7_r$ of the substrate carrier, and/or on the carrier surface $3_o$. The said elastic rings surround the one or several recesses 11 for the one or the several substrates 12, if they are arranged on the upper side 70 of the substrate carrier $7_4$ facing the take-over surface 150.

Also the provision of a peripheral protruding rim 25 on the substrate carrier, and/or of one or several damper member particularly formed as elastic rings, is not limited to the embodiment according to FIG. 3, rather can also by all means be combined with those according to FIGS. 1 and/or 2.

As is further apparent from FIG. 4, positioning organs 29 can be provided, with which substrate carriers 7 can be precisely positioned laterally on, and be prevented from sliding on, the take-over surface $15_o$ as taken-over. Such positioning organs 29 can comprise protrusions, pins etc, with bevelled guiding surfaces, as is in any case known to the skilled person. Also, the provision of such positioning organs can be applied in the embodiment according to FIGS. 1 and 2.

FIG. 5 shows in plan view a substrate carrier 7 or $7_4$ according to the invention, as it is preferably applied to the transport and handing-over arrangement according to the invention. It consists, for example, one-pieced of ferromagnetic stainless steel. On the plan view, film-like substrates 12 are clearly visible within recesses 11, as well as cut-outs 16, by which the weight of the substrate carrier 7 or $7_4$ is optimised to the necessary weight. Furthermore, the thin, peripheral protruding rim 25 can be seen.

FIG. 6 illustrates, highly simplified and schematically, a further embodiment of the transport and handing-over arrangement according to the invention. On a multi-armed transport and handing-over robot 32 (here constructed with two arms), a take-over arrangement 15 is provided on the end of each of the robot arms. The up-and-down movement according to V15 of FIG. 3 is carried out by the up-and-down movement of the two-armed robot 32 as a whole. It is controllably pivotably driven around axis A, which is perpendicular to the carrier surfaces.

One of the take-over arrangements 15 is respectively pivoted over the carrier 3 so as to take-over a substrate carrier 7, with or without a substrate depending on the operating mode, or to deliver the same to the carrier 3. By pivoting the robot, as illustrated with α, for instance the just-taken-over substrate carrier 7 is pivoted into destination position D, and is there, for instance handed, to a further carrier 3'. At the same time, an "unoccupied" take-over arrangement 15 is pivoted into position over carrier 3 due to the multi-arm arrangement.

In FIG. 7, the manufacturing of a treated substrate with a transport and handing-over arrangement according to the invention as hereintofore described is illustrated, simplified, in the form of a function block/signal flow diagram. 3, 3B, 3C and 3D indicate carriers, or transport organs for substrate carriers 7. A transport and handing-over arrangement according to the present invention, illustrated schematically in FIG. 7 by a two-armed robot according to FIG. 6, is arranged before or after a treatment station 35 for substrates. A transport and handing-over arrangement according to the invention can be arranged before and after the treatment station 35, as is in fact shown in FIG. 7. The take-over and handing-over of the substrate carrier 7 between a substrate carrier 3 and a take-over arrangement 15 can be carried out very quickly due to the simple construction, for instance within 500 ms, which significantly raises the throughput of the whole treatment process, as illustrated schematically in FIG. 7, during manufacturing of treated substrates.

The invention claimed is:

1. Transport and handing-over arrangement for disc-shaped substrates, comprising:
a carrier with a carrier surface;
a tray-shaped substrate carrier held on the carrier surface due to its weight, wherein the substrate carrier includes at least one planar recess accommodation for a substrate, a peripheral protruding rim surrounding the at least one planar recess accommodation such that the substrate lies in the planar recess accommodation below the peripheral protruding rim, and at least one part of magnetisable material;
a take-over arrangement with a take-over surface opposite and spaced from the carrier surface,
at least one permanent magnet at the take-over arrangement;
wherein the substrate carrier and the take-over arrangement are controllably movable relative and parallel to each other, and thereby the at least one part of magnetisable material of the substrate carrier is configured to align with the at least one permanent magnet at the take-over surface and create a magnetic force perpendicular to the substrate carrier during take-over of the substrate carrier by the take-over arrangement, thereby avoiding lateral shifting; wherein further:
the distance between the at least one permanent magnet and the at least one part of magnetisable material is controllably variable into first and second predefined distance positions, such that in the first distance position the magnetic force acting on the substrate carrier is larger than the weight of the substrate carrier, and in the second distance position, the magnetic force acting on the substrate carrier is smaller than the weight of the substrate carrier, and
wherein the peripheral protruding rim prevents exposure of the substrate to the take-over surface of the take-over arrangement.

2. Transport and handing-over arrangement, according to claim 1, characterised in that the take-over arrangement comprises, in a pneumatic cylinder, at least one piston movable towards the carrier surface and therefrom, coupled with at least one permanent magnet.

3. Transport and handing-over arrangement, according to claim 2, characterised in that the permanent magnet is encapsulated with the piston in the pneumatic cylinder.

4. Transport and transfer device according to claim 1, characterised in that the take-over arrangement is controllably movable towards the carrier surface and therefrom by means of a drive.

5. Transport and handing-over arrangement, according to claim 1, characterised in that the at least one permanent magnet is covered by a material layer towards the carrier surface.

6. Transport and handing-over arrangement, according to claim 1, characterised in that an elastic damper member is provided between the take-over surface and the substrate carrier and/or between the substrate carrier and the carrier surface, which damps an impact of the substrate carrier on the take-over surface or the carrier surface.

7. Transport and handing-over arrangement, according to claim 6, characterised in that the damper member comprises an elastic ring, which is arranged in the take-over surface and/or in the carrier surface, and/or in a surface of the substrate carrier, and which, in cross-section, protrudes above the surface, on which the elastic ring is arranged.

8. Transport and handing-over arrangement, according to claim 7, characterised in that the elastic ring is arranged on the peripheral protruding rim.

9. Transport and handing-over arrangement, according to claim 1, characterised in that the at least one planar recess accommodation has a similar shape to the substrate, said shape being rectangular, quadratic or circular.

10. Transport and handing-over arrangement, according to claim 1, characterised in that lateral guides for the lateral position of the substrate carrier are provided on the substrate carrier and/or on the take-over surface and/or on the carrier surface.

11. Transport and handing-over arrangement, according to claim 1, characterised in that at least two take-over arrangements are provided, with transfer surfaces along a common plane perpendicular to an axis, and configured to controllably pivot about the axis together.

12. Vacuum treatment installation comprising:
at least one vacuum treatment chamber for substrates, and
at least one transport and take-over arrangement for the substrates according to claim 1 arranged to load the substrates into the at least one vacuum treatment chamber or to unload the substrates out of the at least one vacuum treatment chamber.

* * * * *